(12) United States Patent
Park et al.

(10) Patent No.: US 9,011,995 B2
(45) Date of Patent: Apr. 21, 2015

(54) ACRYLIC PRESSURE-SENSITIVE ADHESIVE COMPOSITIONS

(75) Inventors: Seung-joon Park, Yuseong-gu Daejeon (KR); In-cheon Han, Garak-dong Songpa-gu Seoul (KR); Woo-ha Kim, Donghae-si Gangwon-do (KR); Anna Lee, Doryong-dong Yuseong-gu Daejeon (KR); Suk-ky Chang, Sinseong-dong Yuseong-gu Daejeon (KR)

(73) Assignee: LG Chem, Ltd., Seoul (KR)

( * ) Notice: Subject to any disclaimer, the term of this patent is extended or adjusted under 35 U.S.C. 154(b) by 666 days.

(21) Appl. No.: 12/086,614

(22) PCT Filed: Dec. 14, 2006

(86) PCT No.: PCT/KR2006/005448
§ 371 (c)(1),
(2), (4) Date: Jun. 16, 2008

(87) PCT Pub. No.: WO2007/069856
PCT Pub. Date: Jun. 21, 2007

(65) Prior Publication Data
US 2010/0129569 A1 May 27, 2010

(51) Int. Cl.
| | |
|---|---|
| C08L 33/02 | (2006.01) |
| C08L 33/04 | (2006.01) |
| C08L 35/02 | (2006.01) |
| C09K 19/00 | (2006.01) |
| B32B 7/12 | (2006.01) |
| C08L 33/08 | (2006.01) |
| C08L 33/14 | (2006.01) |

(52) U.S. Cl.
CPC ............ *C08L 33/08* (2013.01); *C08L 33/14* (2013.01); *C08L 33/02* (2013.01); *C08L 2312/00* (2013.01)

(58) Field of Classification Search
USPC ........... 525/221, 222; 428/1.55, 354, 355 AC
See application file for complete search history.

(56) References Cited

U.S. PATENT DOCUMENTS

| | | | |
|---|---|---|---|
| 5,100,963 A | * | 3/1992 | Lin .............................. 525/221 |
| 2005/0181148 A1 | * | 8/2005 | Kim et al. .................... 428/1.55 |

FOREIGN PATENT DOCUMENTS

| | | |
|---|---|---|
| EP | 0 263 686 | 4/1988 |
| JP | 64-066283 | 3/1989 |
| JP | 5-333209 A | 12/1993 |
| JP | 10-279907 | 10/1998 |
| JP | 2000-109771 | 4/2000 |
| JP | 2002-012521 | 1/2002 |
| JP | 2002-121521 A | 4/2002 |
| JP | 2003-049141 | 2/2003 |
| JP | 2004-069975 | 3/2004 |
| JP | 2004-263165 | 9/2004 |
| WO | WO 86/05503 | 9/1986 |
| WO | WO 88/02014 | 3/1988 |
| WO | WO 00/68316 | 11/2000 |

OTHER PUBLICATIONS

English Translation of JP 2002-121521; Apr. 2002; Ebata et al.*
Handbook of Pressure-Sensitive Adhesives and Products; István et al ; Front Page; 2009.*
Handbook of Pressure-Sensitive Adhesives and Products; István et al ; Chapter 5; 2009.*

* cited by examiner

*Primary Examiner* — Karuna P Reddy
(74) *Attorney, Agent, or Firm* — McKenna Long & Aldridge, LLP

(57) ABSTRACT

The present invention relates to an acrylic pressure-sensitive adhesive composition, and more precisely, an acrylic pressure-sensitive adhesive composition which is prepared by copolymerization of a vinyl and/or acrylic monomer having a cross-linkable functional group and comprises 100 weight part of a high molecular weight (meth)acrylic copolymer which is prepared by copolymerization of a vinyl and/or acrylic monomer harboring a cross-linkable functional group and whose weight average molecular weight is 40~100 times as high as the entanglement molecular weight, 5~50 weight part of a low molecular weight (meth)acrylic copolymer which does not contain a cross-linkable functional group and whose weight average molecular weight is 2~15 times as high as entanglement molecular weight, and 0.01~10 weight part of a multifunctional cross-linking agent. The acrylic pressure-sensitive adhesive composition of the present invention has reliable adhesion durability under high temperature and high humidity and at the same time reduces the light leakage due to the stress relaxation and enhances the cutting-efficiency of a polarizing plate.

14 Claims, No Drawings

ACRYLIC PRESSURE-SENSITIVE ADHESIVE COMPOSITIONS

This application claims the benefit of International Application Number PCT/KR/2006/005448 filed on Dec. 14, 2006 and Korean Application No. 10-2005-0123504 filed on Dec. 14, 2005, both of which are hereby incorporated by reference as if fully set forth herein.

TECHNICAL FIELD

The present invention relates to an acrylic pressure-sensitive adhesive composition for a polarizing film, more particularly to an acrylic pressure-sensitive adhesive composition for a polarizing film that is able to provide adhesive durability under high temperature and high humidity conditions, to reduce light leakage owing to its stress relaxation capacity, and to improve the efficiency of cutting a polarizing film.

BACKGROUND ART

In general, a liquid crystal cell containing liquid crystals and a polarizing film are basically needed to manufacture a liquid crystal display device. To attach these together, a proper adhesive layer is required. To improve the functions of a liquid crystal display device, a retardation plate, a wide-viewing angle plate, or a brightness-enhancing film can be additionally laminated on a polarizing plate.

A liquid crystal display device is generally composed of an evenly arranged liquid crystal layer; a multiple structure polarizing plate, wherein a liquid crystal cell comprising a glass plate containing a transparent electrode layer or a plastic board is coated with an adhesive layer; a retardation plate; and a supplementary functional film.

The polarizing plate contains an iodine compound or dichroic polarizing material arranged in a certain direction, and a multi-layered structure is preferably formed using a triacetyl cellulose (TAC) protective film to protect the polarizing element. The polarizing plate might additionally include a retardation film having a unidirectional molecular arrangement, or a wide-viewing angle film such as a liquid crystal film.

The above mentioned films are composed of materials with different molecular structures and compositions, so that their physical properties are different. Especially, under a specific thermal and/or humidity condition, materials having an anisotropic molecular alignment shrink or expand, cause the lack of dimensional stability. As a result, if the polarizing film is fixed by a pressure-sensitive adhesive, a shear stress caused the thermal and/or humidity condition remains, so that light leakage occurs at the region where the stress is concentrated.

To reduce light leakage, it is necessary to reduce the contraction of a polarizing plate under hot or humid conditions. However, it is still very difficult to eliminate stress from a liquid crystal panel loaded with a polarizing plate composed of materials with different physical properties.

The generally acceptable adhesives are rubber-based, acryl-based and silicon-based adhesives. Among these adhesives, the acryl-based adhesive has been the most widely used as a high-functional adhesive composition owing to its properties. To enhance durability, the molecular structure has to be properly modified, particularly in adhesive constitution, molecular weight and molecular weight distribution, cross-linking density, etc. In that case, an adhesive has to have high cohesive strength.

An adhesive layer is loaded on a polarizing plate for attachment to an LCD. If this LCD is used for a long time under hot or humid conditions, contraction of the polarizing plate will be observed and thus stress will be centered thereon. To overcome this problem, an adhesive is needed that allows for stress relaxation.

Japanese Laid-Open Patent Publication No. Hei 1-66283 describes a method of preparing an adhesive polarizing plate, in which an acrylic polymer composed of a (meth)acrylic acid alkyl ester with a C1~C12 alkyl is loaded on the surface of a polarizing plate, and the adhesive layer contains an acrylic polymer composed of 15 weight % of a polymer having a weight average molecular weight of less than 100,000 and 10 weight % of another polymer having a weight average molecular weight of at least 1,000,000. According to this description, the durability of the adhesive is satisfied owing to the high content of the polymer, but a stress relaxation effect has not been shown, suggesting that stress is still centered by the change of polarizing plate size resulting from the high cohesive strength (coefficient of elasticity) of the adhesive.

Korean Patent Publication No. 1998-079266 describes how light leakage is reduced by loading an adhesive composition having a stress relaxation function on a polarizing plate, in which the composition is composed of 100 weight part of a high molecular weight acrylic copolymer having a weight average molecular weight of at least 1,000,000, 20~200 weight part of a low molecular weight acrylic copolymer having a weight average molecular weight of up to 30,000, and 0.005~5 weight part of a multi-functional cross-linking agent. However, according to this description, the content of the low molecular weight acrylic copolymer having a molecular weight of up to 30,000 is too high, whereas the compatibility is too low, so the low molecular weight molecules are inclined to move to the surface as time goes by, suggesting that durability is reduced under high temperature and high humidity conditions, with the generation of air bubbles or exfoliation. However, there is no description of a technical method to regulate a composition composed of low molecular molecules to improve durability.

Japanese Laid-Open Patent publication No. 2000-109771 describes a method to reduce light leakage by using an adhesive composition for a polarizing plate composed of a high molecular weight acrylic copolymer harboring a functional group which has a weight average molecular weight of 600,000~2,000,000, 0.1~50 weight part of an acrylic copolymer harboring a functional group which has a weight average molecular weight of up to 500,000, and up to 5 weight part of a multifunctional cross-linking compound in order to have a stress relaxation effect. However, the medium weight molecules harboring a functional group form additional cross-linking structures, so the concentration of stress due to the contraction of a polarizing plate is still a problem.

Japanese Laid-Open Patent Publication No. 2003-49141 describes a method to reduce light leakage by applying an adhesive composition composed of an acrylic copolymer containing a functional group which has a weight average molecular weight of 1,000,000~2,000,000, a medium molecular weight acrylic copolymer having less than 2 functional groups which has a weight average molecular weight of 30,000~300,000, a low molecular weight acrylic copolymer excluding a functional group that has a weight average molecular weight of 1,000~20,000 (degree of dispersion 1.0~2.5), and a cross-linking agent to a polarizing plate to have a stress relaxation effect. However, the medium molecular weight molecules having a functional group form an additional cross-linking structure as described above, so the stress concentration caused by contraction of a polarizing plate is still a problem to solve. In addition, if the low molecular acrylic copolymer having a molecular weight of less than 20,000 is used for a long time, surface migration will be observed with reduced durability.

Japanese Laid-Open Patent Publication No. 2002-12521 describes an effort to reduce the stress concentration by using an adhesive composition for a polarizing plate which is composed of 100 weight part of a high molecular weight acrylic copolymer having a functional group which has a weight average molecular weight of 1,000,000~2,500,000, 10~100 weight part of a low molecular weight acrylic copolymer having a weight average molecular weight of 30,000~100,000, a multifunctional cross-linking compound containing at least two functional groups, and a silane compound. However, in this description only the weight average molecular weights of the acrylic copolymers have been given, without an explanation of their effect.

In general, the physical behavior of a polymer does not simply depend on the weight average molecular weight, it depends more on the relative size to the entanglement molecular weight. So, the composition of an acrylic copolymer has to be determined by considering the entanglement molecular weight. The modulus and viscosity of a polymer, two major factors affecting the stress relaxation property, are rapidly changed when the molecular weight of the polymer is two or three times larger than the entanglement molecular weight. The entanglement molecular weight of (meth)acrylic acid alkyl ester depends on the carbon number of the alkyl group therein. Therefore, when a low molecular weight molecule is added in order to enhance the stress relaxation capacity, the entanglement molecular weight of the low molecular weight molecule has to be considered. If the molecular weight of a low molecular weight molecule is lower than the entanglement molecular weight, an adhesive will flow out of the section when a polarizing plate is cut, or the polarizing plate will be easily contaminated by the discharged adhesive. Besides, the low molecular weight molecules are apt to move to the interface between the glass board of a liquid crystal panel and TAC, resulting in the decrease of durability under high temperature and high humidity conditions.

Therefore, a novel adhesive for a polarizing plate has been needed that is able to improve the cutting-efficiency without reducing durability under high temperature and high humidity conditions and long-term use, and to reduce light leakage of a polarizing plate using the same.

DISCLOSURE OF INVENTION

Technical Problem

In order to solve the above problems, the present invention provides an acrylic pressure-sensitive adhesive composition having satisfactory durability under high temperature and high humidity conditions, and reduces light leakage with good stress relaxation capacity.

It is another object of the present invention to provide a polarizing plate with reduced light leakage and cutting-efficiency.

Technical Solution

The above object and other objects of the present invention can be achieved by the following embodiments of the present invention.

To achieve the above objects, the present invention provides an acrylic pressure-sensitive adhesive composition composed of a) 100 weight part of a high molecular weight (meth) acrylic copolymer which is prepared by copolymerization of a vinyl and/or acrylic monomer harboring a cross-linkable functional group and whose weight average molecular weight is 40~100 times as high as the entanglement molecular weight;

b) 5~50 weight part of a low molecular weight (meth) acrylic copolymer which does not contain a cross-linkable functional group and whose weight average molecular weight is 2~15 times as high as the entanglement molecular weight; and c) 0.01~10 weight part of a multifunctional cross-linking agent.

The present invention also provides a polarizing plate in which an adhesive layer containing the acrylic pressure-sensitive adhesive composition is loaded on one side or both sides of the polarizing film.

The present invention further provides an LCD which contains a liquid crystal panel in which the polarizing plate is loaded on one or both sides of the liquid crystal cell.

Hereinafter, the present invention is described in detail.

To reduce the risk of surface migration of a low molecular weight copolymer which causes the durability problem and to inhibit the adhesive from flowing out during the preparation of a polarizing plate, the present inventors used a low molecular weight molecule whose weight average molecular weight is at least twice as high as its entanglement molecular weight. As a result, even if the low molecular weight molecule does not include a functional group, it does not reduce the durability by surface migration. In addition, without a functional group, a network structure formed by a low molecular weight molecule having a functional group is not formed, resulting in the prevention of stress concentration and light leakage and enhancement of durability.

The acrylic pressure-sensitive adhesive composition of the present invention is composed of: a) 100 weight part of a high molecular (meth)acrylic copolymer which is prepared by copolymerization of a vinyl and/or acrylic monomer harboring a cross-linkable functional group and whose weight average molecular weight is 40~100 times as high as the entanglement molecular weight; b) 5~50 weight part of a low molecular weight (meth)acrylic copolymer which does not contain a cross-linkable functional group and whose weight average molecular weight is 2~15 times as high as the entanglement molecular weight; and c) 0.01~10 weight part of a multi-functional cross-linking agent.

The entanglement molecular weight herein was measured by RMS-800 (Rheometrics). Particularly, storage modulus and loss modulus of a (meth)acrylic copolymer without a multifunctional cross-linking agent were measured by frequency sweep using an 8 □ parallel plate fixture of 1 □ thickness and at 10% strain. Tan value was calculated by the ratio of loss modulus to storage modulus. Plateau modulus was calculated based on the storage modulus of frequency at the lowest peak of tan value. The entanglement molecular weight is calculated based on the plateau modulus by the following mathematical formula 1.

$$M_e = \rho RT/G_N \qquad \text{MathFigure 1}$$

Wherein, $M_e$ is entanglement molecular weight, $\rho$ is density of a polymer, R is the universal gas constant, T is absolute temperature and $G_N$ is plateau modulus.

The high molecular weight (meth)acrylic copolymer of a) in the present invention can be a copolymer prepared by copolymerization of i) 91.0~99.9 weight % of a (meth)acrylic acid ester monomer having a C1~C12 alkyl and ii) 0.1~9.0 weight % of a vinyl and/or acrylic monomer having a cross-linkable functional group.

The (meth)acrylic acid ester monomer of a) i) is preferably a C1~C12 alky ester monomer, and more preferably a C2~C8 alky ester monomer, in order to maintain cohesive strength at high temperature since cohesive strength of an adhesive is reduced once an alkyl group is formed as a long chain.

For example, the (meth)acrylic acid ester monomer having a C1~C12 alkyl can be a single compound or a mixture of at least two compounds selected from a group consisting of butyl(meth)acrylate, 2-ethylhexyl(meth)acrylate, ethyl (meth)acrylate, methyl(meth)acrylate, n-propyl(meth)acrylate, isopropyl(meth)acrylate, t-butyl(meth)acrylate, pentyl (meth)acrylate, n-octyl(meth)acrylate, isooctyl(meth) acrylate, isononyl(meth)acrylate, 2-ethylbutyl(meth)acrylate and benzylacrylate.

The preferable content of the (meth)acrylic acid ester monomer having a C1~C12 alkyl in the acrylic copolymer is 91.0~99.9 weight %. If the content is less than 91.0 weight %, adhesion to a polarizing plate will be reduced. If the content is more than 99.9 weight %, cohesive strength will be reduced, resulting in the decrease of durability.

The vinyl and/or acrylic monomer having a cross-linkable functional group of a) provides cohesive strength or adhesive strength by chemical bonds to prevent the break-down of cohesive strength of an adhesive under high temperature and high humidity conditions by reacting with a multifunctional cross-linking agent.

The vinyl and/or acrylic monomer having a cross-linkable functional group can be a single compound or a mixture of at least two compounds selected from a group consisting of monomers containing a hydroxyl group such as 2-hydroxyethyl(meth)acrylate, 2-hydroxypropyl(meth)acrylate, 2-hydroxyethyleneglycol(meth)acrylate and 2-hydroxypropyleneglycol(meth)acrylate; and monomers harboring a carboxylic acid such as acrylic acid, methacrylic acid, acrylic acid dimer, itaconic acid, maleic acid and maleic anhydride.

The preferable content of the vinyl and/or acrylic monomer having a cross-linkable functional group in the acrylic copolymer is 0.1~9.0 weight %. If the content is less than 0.1 weight %, cohesive failure will be observed under high temperature or high humidity conditions, resulting in the decrease of adhesive force. On the contrary, if the content is more than 9.0 weight %, compatibility and fluidity will be decreased, resulting in the decrease of stress-relaxation due to an increase of cohesive strength.

The high molecular weight (meth)acrylic copolymer composed of the above compounds preferably has a weight average molecular weight that is 40~100 times higher than its entanglement molecular weight, and more preferably has a weight average molecular weight that is 50~80 times higher than its entanglement molecular weight. If the weight average molecular weight is less than 40 times the entanglement molecular weight, cohesive strength will not be satisfactory and thus air bubbles or de-lamination will be observed under high temperature or high humidity conditions, resulting in the decrease of durability. If the weight average molecular weight is more than 100 times the entanglement molecular weight, relaxation of stress concentration will be in doubt.

The low molecular weight (meth)acrylic copolymer of b) comprises the (meth)acrylic monomer having a C1~C12 alkyl and examples are as described in the high molecular weight (meth)acrylic copolymer.

To reduce light leakage and enhance durability by inhibiting surface migration of low molecular weight molecules, and relax stress concentration by reducing contamination with an adhesive during the preparation of a polarizing plate, the weight average molecular weight of the copolymer is preferably 2~15 times as high as the entanglement molecular weight, and more preferably 4~15 times as high as the entanglement molecular weight.

If the weight average molecular weight of a low molecular weight (meth)acrylic copolymer is less than two times the entanglement molecular weight, the entanglement effect of the low molecular weight molecule will be diminished, so an adhesive might discharge from the section of a polarizing plate when it is cut and thus the polarizing plate will be contaminated by the discharged adhesive. If the weight average molecular weight is more than 15 times the entanglement molecular weight, softness will be reduced, suggesting that it will be difficult to reduce light leakage.

The preferable content of the low molecular weight (meth)acrylic copolymer is 5~50 weight part for 100 weight part of the high molecular weight (meth)acrylic copolymer. If the content is less than 5 weight part, stress concentration of a polarizing plate will not be effectively relaxed, whereas if the content is more than 50 weight part, durability will be in question.

The method of preparing the high molecular weight (meth)acrylic copolymer and low molecular weight (meth)acrylic copolymer is not limited, and any conventional method such as solution polymerization, photopolymerization, bulk polymerization, suspension polymerization and emulsion polymerization can be used. Among these methods, solution polymerization is preferred. The preferable polymerization temperature is 50~140? and in the polymerization initiator is added after the monomers are mixed evenly.

The polymerization initiator for the preparation of the high molecular weight (meth)acrylic copolymer and the low molecular weight (meth)acrylic copolymer can be a single compound or a mixture of compounds selected from a group consisting of azo-based polymerization initiators such as azobisisobutyronitrile and azobiscyclohexanecarbonitrile, and peroxides such as benzoyl peroxide and acetyl peroxide.

To prepare the low molecular weight (meth)acrylic acid copolymer, it is preferred to use a polymerization initiator together with a chain transfer agent, which is exemplified by mercaptans such as laurylmercaptan, n-dodecylmercaptan and n-octylmercaptan, and α-methyl styrene dimer, etc.

The multifunctional cross-linking agent of c) of the present invention plays a role in increasing cohesive strength of an adhesive by reacting with a carboxyl group and a hydroxyl group, etc.

The multifunctional cross-linking agent can be selected from a group consisting of an isocyanate compound, an epoxy compound, an aziridine compound, and a metal chelate compound, and an isocyanate cross-linking agent is preferred.

The isocyanate compound can be selected from a group consisting of toluenediisocyanate, xylenediisocyanate, diphenylmethanediisocyanate, hexamethylenediisocyanate, isoformdiisocyanate, tetramethylxylenediisocyanate, naphthalenediisocyanate and their reactants with a polyol such as trimethylolpropane.

The epoxy compound can be selected from a group consisting of ethyleneglycoldiglycidylether, triglycidylether, trimethylolpropanetriglycidylether, N,N,N',N'-tetraglycidylethylenediamine and glycerindiglycidylether.

The aziridine compound can be selected from a group consisting of N,N'-toluene-2,4-bis(1-aziridinecarboxide), N,N'-diphenylmethane-4,4'-bis(1-aziridinecarboxide), triethylenemelanin, bisisoprothaloyl-1-(2-methylaziridine) and tri-1-aziridinylphosphineoxide.

The metal chelate compound can be selected from a group consisting of those compounds where a polyvalent metal such as aluminum, iron, zinc, tin, titan, antimony, magnesium and vanadium is coordinated in acetylacetone or acetoacetate-ethyl.

It is preferred for the multifunctional cross-linking agent not to induce a cross-linking reaction of a functional group of the cross-linking agent during the mixing process for even coating. After coating, drying and aging, a cross-linking structure is formed to give elasticity and a strong cohesive force to an adhesive layer. At this time, the strong cohesive force of an adhesive can improve adhesive properties including durability and cutting-efficiency.

The preferable content of the multifunctional cross-linking agent in 100 weight part of the acrylic copolymer is 0.01~10 weight part. Within the above content range, an adhesive exhibits excellent cohesive strength but no problems in durability including separation or coming off.

The acrylic pressure-sensitive adhesive composition of the present invention composed of the above mentioned components can additionally include a silane coupling agent or a tackifier resin, if necessary.

The silane coupling agent plays a role in improving the adhesive stability of the acrylic pressure-sensitive adhesive layered onto a glass plate and increases heat resistance and moisture resistance. That is, during the long-term exposure of an adhesive to high temperature and high humidity, the silane coupling agent improves the adhesive stability.

The silane coupling agent can be a single compound or a mixture of at least two compounds selected from a group consisting of γ-glycidoxypropyltrimethoxysilane, γ-glycidoxypropylmethyldiethoxysilane, γ-glycidoxypropyltriethoxysilane, 3-mercaptopropyltrimethoxysilane, vinyltrimethoxysilane, vinyltriethoxysilane, γ-methacryloxypropyltrimethoxysilane, γ-methacryloxypropyltriethoxysilane, γ-aminopropyltrimethoxysilane, γ-aminopropyltriethoxysilane, 3-isocyanatepropyltriethoxysilane and γ-acetoacetatepropyltrimethoxysilane.

The preferable content of the silane coupling agent is 0.005~5 weight part for 100 weight part of the acrylic copolymer. If the content is within the above range, adhesive stability and durability will be greatly increased under high temperature and high humidity conditions.

The tackifier resin herein plays a role in regulating the adhesion capacity of the acrylic pressure-sensitive adhesive.

The tackifier resin can be a single compound or a mixture of at least two compounds selected from a group consisting of (hydrogenated)hydrocarbon resin, (hydrogenated)rosin resin, (hydrogenated)rosinester resin, (hydrogenated)terpene resin, (hydrogenated)terpenephenol resin, polymerized rosin resin and polymerized rosinester resin.

The preferable content of the tackifier resin is 1~100 weight part for 100 weight part of the acrylic copolymer. A content within the above range is more helpful for increasing compatibility and cohesive strength.

The adhesive composition of the present invention can additionally include any additive selected from a group consisting of an acrylic plasticizer, an epoxy resin, a hardener, an UV stabilizer, an antioxidant, a toning agent, a reinforcing agent, a filler, an antifoaming agent and a surfactant.

The acrylic pressure-sensitive adhesive composition of the present invention comprising the above compounds can be prepared by the conventional methods, for example thermal curing or UV curing.

The preferable cross-linking density of the acrylic pressure-sensitive adhesive composition of the present invention is 20~75%, and more preferably 25~70% for the optimum balance of physical properties. The cross-linking density indicates the weight % of the cross-linked part of the acrylic pressure-sensitive adhesive which is insoluble in a solvent, and measured by the gel content measuring method. If the cross-linking density is less than 20%, cohesive strength of the adhesive composition and adhesive durability will be reduced along with the generation of bubbles or separation. If the cross-linking density is more than 75%, relaxation of stress concentration caused by contraction of a polarizing plate will not be satisfied.

The present invention further provides a polarizing plate containing the adhesive composition of the present invention as an adhesive layer. Particularly, one side or both sides of the polarizing plate are loaded with an adhesive layer containing the adhesive composition of the present invention.

A polarizing film or device for the polarizing plate is not limited. The polarizing film can be any film prepared by applying such polarizing components as iodine or dichromatic dye onto a polyvinyl alcohol resin and stretching the prepared mixture. The thickness of a polarizing film is not limited either. Herein, the polyvinyl alcohol resin can be one of polyvinyl alcohol, polyvinyl formal, polyvinylacetal, ethylene and vinylacetate copolymer hydrolysate.

Both sides of a polarizing film can be coated with multi-structured films containing several protective films, for example a cellulose film such as triacetyl cellulose; a polycarbonate film; a polyester film such as terephthalate; a polyethersulfone film; a polyolefin film harboring polyethylene, polypropylene, cyclic or norbornene structure; and a polyolefin film such as ethylene propylene copolymer. The thickness of the protective film is not limited and any general thickness is acceptable.

A method to form an adhesive layer on a polarizing film is not limited, either. For example, an adhesive can be applied and dried on a polarizing film surface using a bar coater, or an adhesive can be applied and dried on a removable substrate surface and then the formed adhesive layer on the removable substrate surface is transferred and aged on the surface of a polarizing film.

The polarizing plate of the present invention can contain one or more additional layers such as a protective layer, a reflecting layer, an anti-glare layer, a retardation plate, a wide-viewing angle film, or a brightness enhancing film to provide additional functions.

The polarizing plate containing the adhesive composition of the present invention can be widely applied to any general LCD and applicable liquid crystal panels are not limited. However, it is preferred that the polarizing plate coated with the adhesive composition of the present invention be applied onto one or both sides of the liquid crystal cell of the liquid crystal panel to produce an LCD.

As explained hereinbefore, the acrylic pressure-sensitive adhesive composition of the present invention exhibits reduced light leakage by relaxing stress caused by contraction of a polarizing plate due to long-term use under hot or humid conditions, but adhesion durability is not diminished. In addition, by using the adhesive composition of the present invention, discharge of the adhesive while cutting the polarizing plate can be inhibited.

BEST MODE FOR CARRYING OUT THE INVENTION

Practical and presently preferred embodiments of the present invention are illustrated as shown in the following examples.

However, it will be appreciated that those skilled in the art, on consideration of this disclosure, may make modifications and improvements within the spirit and scope of the present invention.

EXAMPLES

Manufacturing Example 1

To a 1 L reactor equipped with a cooling device for the regulation of temperature and the reflux of nitrogen gas was added a monomer mixture composed of 88 weight part of n-butylacrylate (BA), 10 weight part of ethylacrylate (EA) and 2 weight part of acrylic acid (AA), to which 120 weight part of ethylacetate (EAc) was added as a solvent. Oxygen was eliminated by purging with nitrogen gas for one hour, and then the temperature was maintained at 62° C. After mixing the mixture evenly, 0.03 weight part of 45% azobisisobutylonitrile (AIBN) diluted in ethylacetate was added as a reaction initiator, followed by reaction for 8 hours. Upon completion of the reaction, the mixture was diluted in ethylacetate to give a high molecular weight (meth)acrylic copolymer (H-1) in which the solid content was 17 weight %, the entanglement molecular weight was 25,000, and the weight average molecular weight was 64 times higher than the entanglement molecular weight.

Manufacturing Examples 2?3

A high molecular weight (meth)acrylic copolymer was prepared in the same manner as described in Manufacturing Example 1, except that the components and mixing ratio thereof are as shown in Table 1.

Manufacturing Example 4

To a 1 L reactor equipped with a cooling device for the regulation of temperature and the reflux of nitrogen gas were added a monomer mixture composed of 96 weight part of n-butylacrylate (BA) and 4.0 weight part of ethylacrylate (EA), and 2 weight part of acrylic acid (AA), and 0.5 weight part of dodecylmercaptan (DDM) as a chain transfer agent, to which 120 weight part of ethylacetate (EAc) was added as a solvent. Oxygen was eliminated by purging with nitrogen gas for one hour, and then the temperature was maintained at 60° C. After mixing the mixture evenly, 0.03 weight part of 45% azobisisobutylonitrile (AIBN) diluted in ethylacetate was added as a reaction initiator, followed by reaction for 8 hours to give a low molecular weight (meth)acrylic copolymer (L-1) in which the solid content was 45 weight %, the entanglement molecular weight was 22,000, and the weight average molecular weight was 5.2 times higher than the entanglement molecular weight.

Manufacturing Examples 5~9

A low molecular weight (meth)acrylic copolymer was prepared in the same manner as described in Manufacturing Example 4, except that the components and mixing ratio thereof are as shown in Table 1.

TABLE 1

| | | | Manufacturing Example | | | | | | | | |
|---|---|---|---|---|---|---|---|---|---|---|---|
| | | | High molecular weight (meth)acrylic copolymer | | | Low molecular weight (meth)acrylic copolymer | | | | | |
| | | | 1 | 2 | 3 | 4 | 5 | 6 | 7 | 8 | 9 |
| | | | H-1 | H-2 | H-3 | L-1 | L-2 | L-3 | L-4 | L-5 | L-6 |
| Composition | monomer | n-BA | 88.0 | 88.0 | 98.0 | 96.0 | 92.0 | 80.0 | 90.0 | 99.3 | 90 |
| | | EA | 10.0 | 8.0 | — | 4.0 | — | — | 10.0 | 0.7 | — |
| | | 2-EHA | — | — | — | — | 8.0 | 20.0 | — | — | 8.0 |
| | | 2-HEMA | — | — | 2.0 | — | — | — | — | — | — |
| | | AA | 2.0 | 4.0 | — | — | — | — | — | — | 2.0 |
| | Chain transfer agent | DDM | — | — | — | 0.5 | 0.2 | 0.05 | 1.5 | 0.01 | 0.2 |
| | Polymerization initiator | AIBN | 0.03 | 0.03 | 0.03 | 0.03 | 0.03 | 0.03 | 0.03 | 0.03 | 0.03 |
| | Solvent | EAc | 120 | 150 | 150 | 120 | 120 | 120 | 120 | 120 | 120 |
| Entanglement molecular weight (×10,000) | | | 2.5 | 1.7 | 2.5 | 2.2 | 2.5 | 3.5 | 2.1 | 2.1 | 2.3 |
| Weight average molecular weight/Entanglement molecular weight | | | 64 | 35.3 | 56 | 5.2 | 6.7 | 9.1 | 1.4 | 17.1 | 6.5 | n-BA: n-butylacrylate

EA: ethylacrylate

2-EHA: 2-ethylhexylacrylate

2-HEMA: 2-hydroxymethacrylate

AA: acrylic acid

AIBN: azobisisobutyronitrile n-DDM: n-dodecylmercaptan

EAc: ethylacetate

Example 1

Mixing

To 100 weight part of the high molecular weight (meth)acrylic copolymer (H-1, solid content) prepared in Manufacturing Example 1 was added 20 weight part of the low molecular weight (meth)acrylic copolymer (L-1, solid content) prepared in Manufacturing Example 4. To the mixture was added 0.5 weight part of tolylenediisocyanate additive (TD1-1) of isocyanate trimethylolpropane as a multifunctional cross-linking agent. To achieve the satisfactory level of coating, the mixture was diluted and well mixed. A release paper was coated with the mixture, followed by drying to give an adhesive layer of 30 □ thickness.

(Laminating)

The prepared adhesive layer was laid on an iodine polarizing plate at 185 □ thickness, followed by adhesive processing.

Examples 2~3 and Comparative Examples 1~6

Adhesive layers were prepared in the same manner as described in Example 1, except that the components and mixing ratio thereof are as shown in Table 2.

TABLE 2

|  |  | Example | | | Comparative Example | | | | | |
|---|---|---|---|---|---|---|---|---|---|---|
|  |  | 1 | 2 | 3 | 1 | 2 | 3 | 4 | 5 | 6 |
| High molecular compound | H-1 | 100 | — | 100 | — | 100 | — | 100 | 100 | 100 |
|  | H-2 | — | — | — | 100 | — | — | — | — | — |
|  | H-3 | — | 100 | — | — | — | 100 | — | — | — |
| Low molecular compound | L-1 | 20 | — | — | 20 | — | 55 | — | — | — |
|  | L-2 | — | 15 | — | — | — | — | 3 | — | — |
|  | L-3 | — | — | 30 | — | — | — | — | — | — |
|  | L-4 | — | — | — | — | 20 | — | — | — | — |
|  | L-5 | — | — | — | — | — | — | — | 10 | — |
|  | L-6 | — | — | — | — | — | — | — | — | 20 |
| Cross-linking agent |  | 0.5 | 0.5 | 0.5 | 0.5 | 0.5 | 0.5 | 0.5 | 0.5 | 0.5 |

The polarizing plates coated with the adhesives prepared in Examples 1~3 and Comparative Examples 1~6 were tested for durability, light leakage (light transmission uniformity), and discharging. The results are shown in Table 3.

(Durability)

The polarizing plates (90 □ 170 □) coated with the adhesives prepared in Examples 1~3 and Comparative Examples 1~6 were attached to both sides of a glass substrate (110 □ 190 □ 0.7 □) so the optical absorption axis was crossed. The pressure was 5 □/□ and the process was performed in a clean room so as not to generate bubbles or impurities. The samples were left for 1,000 hours at 60° C. and 90% relative humidity. Moisture resistance was investigated by observing bubbles or delamination. Bubble generation or delamination was investigated after standing for 1000 hours at 80° C. to evaluate heat resistance.

Samples were left for 24 hours at room temperature before evaluation. The polarizing plates coated with the adhesives prepared in Examples 1~3 and Comparative Examples 1~6 were left for over 5 months and then their durability was evaluated (○: no air bubbles or exfoliation observed, Δ: air bubbles or delamination observed at minimum level, x: air bubbles or delamination observed at high level).

(Light Leakage (Light Transmission Uniformity))

To investigate the uniformity of light transmission of the samples, the same samples used for the durability test were tested in a dark room using a backlight to observe light leakage. Each polarizing plate (200 □ 200 □) coated with the adhesives prepared in Examples 1~3 and Comparative Examples 1~6 was crossed at an angle of 90 on both sides of a glass substrate (210 □ 210 □ 0.7 □), followed by investigation of the uniformity of light transmission (○: Non-uniformity of light transmission is hardly observed by the naked eye, Δ: Non-uniformity of light transmission is a little observed, x: Non-uniformity of light transmission is clearly observed).

(Discharge of the Adhesive)

The polarizing plates (90 □ 170 □) coated with the adhesives prepared in Examples 1~3 and comparative Examples 1~6 were cut with a Thompson cutter, and then each section of the polarizing plate was observed under a microscope to investigate discharge of the adhesive (○: Good, discharge of the adhesive was less than 2 □, Δ: Not bad, discharge of the adhesive was 0.2~0.5 □, x: Bad, discharge of the adhesive was at least 5 □).

TABLE 3

|  | Example | | | Comparative Example | | | | | |
|---|---|---|---|---|---|---|---|---|---|
|  | 1 | 2 | 3 | 1 | 2 | 3 | 4 | 5 | 6 |
| Durability | ○ | ○ | ○ | x | x | x | ○ | ○ | ○ |
| Light leakage | ○ | ○ | ○ | Δ | x | Δ | ○ | ○ | ○ |
| Running out | ○ | ○ | ○ | ○ | ○ | ○ | x | x | x |

As shown in Table 3, the adhesives prepared in Examples 1~3 according to the method of the present invention exhibited acceptable durability and light leakage (light transmission uniformity) and the adhesive was not discharged from a section of the polarizing plate during cutting. In the meantime, the adhesive of Comparative Example 1 which contained the high molecular weight (meth)acrylic copolymer having a weight average molecular weight 35 times as high as the entanglement molecular weight, and the adhesive of Comparative Example 2 which contained the low molecular weight (meth)acrylic copolymer having a weight average molecular weight 1.4 times as high as the entanglement molecular weight exhibited poor durability. The adhesive of Comparative Example 3 including the low molecular weight (meth)acrylic copolymer at 55 weight part also exhibited poor durability. The adhesive of Comparative Example 4 containing 3 weight part of the low molecular weight (meth) acrylic copolymer and the adhesive of Comparative Example 5 having a weight average molecular weight 17.1 times as high as the entanglement molecular weight exhibited acceptable durability and adhesive discharge was hardly observed during cutting of the polarizing plate, but light leakage was significant. The adhesive of Comparative Example 6 containing the low molecular weight (meth)acrylic copolymer harboring a functional group exhibited acceptable durability and the adhesive was not discharged during cutting of the polarizing plate, but light leakage was significant.

INDUSTRIAL APPLICABILITY

As explained hereinbefore, the acrylic pressure-sensitive adhesive composition of the present invention exhibits excellent significant properties, including adhesion durability under high temperature and high humidity conditions, and at the same time is very effective for stress relaxation. So, with the adhesive composition of the present invention, light leakage is reduced and cutting efficiency of a polarizing plate is enhanced. More precisely, the composition of the present invention is effective at relaxing the stress caused by contraction of a polarizing plate during long-term use under hot or humid conditions, resulting in the reduction of light leakage.

Those skilled in the art will appreciate that the conceptions and specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the present invention as set forth in the appended claims.

The invention claimed is:

1. An acrylic pressure-sensitive adhesive composition for a polarizing plate, comprising:
    a) 100 weight part of a high molecular weight (meth) acrylic copolymer which is prepared by copolymerization of a vinyl and/or acrylic monomer having a cross-linkable functional group and whose weight average molecular weight is 56~64 times as high as the entanglement molecular weight;
    b) 5~50 weight part of a low molecular weight (meth) acrylic copolymer which does not contain a cross-linkable functional group and whose weight average molecular weight is 9.1~15 times as high as the entanglement molecular weight; and
    c) 0.01~10 weight part of a multifunctional cross-linking agent.

2. The acrylic pressure-sensitive adhesive composition for a polarizing plate according to claim 1, wherein the high molecular weight (meth)acrylic copolymer of a) is comprised of
    i) 91.0~98.0 weight % of a (meth)acrylic acid ester monomer having a C1~C12 alkyl and
    ii) 2~9.0 weight % of a vinyl and/or acrylic monomer having a cross-linkable functional group.

3. The acrylic pressure-sensitive adhesive composition for a polarizing plate according to claim 2, wherein the (meth) acrylic acid ester monomer having a C1~C12 alkyl is one or more compounds selected from a group consisting of butyl (meth)acrylate, 2-ethylhexyl(meth)acrylate, ethyl(meth) acrylate, methyl(meth)acrylate, n-propyl(meth)acrylate, iso-propyl(meth)acrylate, t-butyl(meth)acrylate, pentyl(meth) acrylate, n-octyl(meth)acrylate, isooctyl(meth)acrylate, isononyl(meth)acrylate, 2-ethylbutyl(meth)acrylate and benzylacrylate.

4. The acrylic pressure-sensitive adhesive composition for a polarizing plate according to claim 2, wherein the vinyl and/or acrylic monomer having a cross-linkable functional group of a) ii) is one or more compounds selected from a group consisting of 2-hydroxyethyl(meth)acrylate, 2-hydroxypropyl(meth)acrylate, 2-hydroxyethyleneglycol(meth) acrylate, 2-hydroxypropyleneglycol(meth)acrylate, acrylic acid, methacrylic acid, acrylic acid dimer, itaconic acid, maleic acid and maleic anhydride.

5. The acrylic pressure-sensitive adhesive composition for a polarizing plate according to claim 1, wherein the low molecular weight (meth)acrylic copolymer of b) is comprised of a (meth)acrylic monomer having a C1~C12 alkyl.

6. The acrylic pressure-sensitive adhesive composition for a polarizing plate according to claim 5, wherein the (meth) acrylic acid ester monomer having a C1~C12 alkyl is one or more compounds selected from a group consisting of butyl (meth)acrylate, 2-ethylhexyl(meth)acrylate, ethyl(meth) acrylate, methyl(meth)acrylate, n-propyl(meth)acrylate, iso-propyl(meth)acrylate, t-butyl(meth)acrylate, pentyl(meth) acrylate, n-octyl(meth)acrylate, isooctyl(meth)acrylate, isononyl(meth)acrylate, 2-ethylbutyl(meth)acrylate and benzylacrylate.

7. The acrylic pressure-sensitive adhesive composition for a polarizing plate according to claim 1, wherein the multi-functional cross-linking agent of c) is one or more compounds selected from a group consisting of an isocyanate compound, an epoxy compound, an aziridine compound, and a metal chelate compound.

8. The acrylic pressure-sensitive adhesive composition for a polarizing plate according to claim 1, wherein the acrylic pressure-sensitive adhesive composition additionally includes a silane coupling agent or a tackifier resin.

9. The acrylic pressure-sensitive adhesive composition for a polarizing plate according to claim 1, wherein the acrylic pressure-sensitive adhesive composition additionally includes one or more additives selected from a group consisting of an acrylic plasticizer, an epoxy resin, a hardener, a UV stabilizer, an antioxidant, a toning agent, a reinforcing agent, a filler, an antifoaming agent and a surfactant.

10. The acrylic pressure-sensitive adhesive composition for a polarizing plate according to claim 1, wherein the cross-linking density of the acrylic pressure-sensitive adhesive composition is 20~75%.

11. A polarizing plate in which one side or both sides are coated with an adhesive layer containing any adhesive composition of claim 1.

12. The polarizing plate according to claim 11, wherein the polarizing plate additionally includes one or more layers selected from a group consisting of a protective layer, a reflecting layer, an anti-glare layer, a retardation plate, a wide-viewing angle film and a brightness enhancing film.

13. A liquid crystal display (LCD) device containing a liquid crystal panel wherein one side or both sides of the liquid crystal cell are covered with the polarizing plate of claim 11.

14. The acrylic pressure-sensitive adhesive composition for a polarizing plate according to claim 1, wherein the cross-linkable functional group is a hydroxyl group and the multi-functional cross-linking agent is an isocyanate cross-linking agent.

* * * * *